(12) United States Patent
Sato et al.

(10) Patent No.: US 7,094,479 B2
(45) Date of Patent: Aug. 22, 2006

(54) SURFACE-COATED CUTTING TOOL MEMBER HAVING HARD COATING LAYER EXHIBITING SUPERIOR WEAR RESISTANCE DURING HIGH SPEED CUTTING OPERATION AND METHOD FOR FORMING HARD COATING LAYER ON SURFACE OF CUTTING TOOL

(75) Inventors: Kazunori Sato, Akashi (JP); Akihiro Kondo, Akashi (JP); Yusuke Tanaka, Akashi (JP)

(73) Assignees: Mitsubishi Materials Kobe Tools Corporation, Hyogo-Ken (JP); Mitsubishi Materials Corporation, Tokyo (JP)

( * ) Notice: Subject to any disclaimer, the term of this patent is extended or adjusted under 35 U.S.C. 154(b) by 0 days.

(21) Appl. No.: 10/501,805

(22) PCT Filed: Jan. 14, 2003

(86) PCT No.: PCT/JP03/00220

§ 371 (c)(1),
(2), (4) Date: Jul. 19, 2004

(87) PCT Pub. No.: WO03/061884

PCT Pub. Date: Jul. 31, 2003

(65) Prior Publication Data

US 2005/0129986 A1  Jun. 16, 2005

(30) Foreign Application Priority Data

Jan. 21, 2002 (JP) ............................. 2002-011478
Feb. 26, 2002 (JP) ............................. 2002-049893
Mar. 6, 2002 (JP) ............................. 2002-060208

(51) Int. Cl.
*B23B 27/14* (2006.01)
*C23C 14/06* (2006.01)

(52) U.S. Cl. ............................. 428/698; 51/307; 51/309; 428/212; 428/216; 428/336; 428/699; 204/192.12; 204/192.15; 204/192.16; 204/192.38

(58) Field of Classification Search .............. 428/212, 428/216, 698, 336, 699; 51/307, 309; 204/192.1, 204/192.12, 192.15, 192.16, 192.38
See application file for complete search history.

(56) References Cited

U.S. PATENT DOCUMENTS 5,503,912 A * 4/1996 Setoyama et al. .......... 428/699

(Continued)

FOREIGN PATENT DOCUMENTS

JP 63-62875 A 3/1988

(Continued)

*Primary Examiner*—Archene Turner
(74) *Attorney, Agent, or Firm*—Darby & Darby

(57) ABSTRACT

A surface-coated cutting tool member includes a tungsten carbide based cemented carbide substrate, a titanium carbonitride based cermet substrate, or a cubic boron nitride based sintered substrate; and a hard coating layer of a nitride compound containing aluminum and titanium, formed on a surface of the substrate using a physical vapor deposition method in an overall average thickness of 1 to 15 μm. The hard coating layer has a component concentration profile in which maximum aluminum containing points and minimum aluminum containing points appear alternatingly and repeatedly at a distance from 0.01 to 0.1 μm in a direction of thickness of the hard coating layer. The amount of contained aluminum (or titanium) is changed from the maximum aluminum containing points to the minimum aluminum containing points. The maximum aluminum containing points satisfy a formula: $(Al_XTi_{1-X})N$, wherein X is between 0.70 to 0.95. The minimum aluminum containing points satisfy a formula: $(Al_YTi_{1-Y})N$, wherein Y is between 0.40 to 0.65.

2 Claims, 5 Drawing Sheets

U.S. PATENT DOCUMENTS 5,700,551 A * 12/1997 Kukino et al. ............... 428/698
6,309,738 B1 * 10/2001 Sakurai ........................ 51/307
6,395,379 B1 * 5/2002 Braendle ..................... 428/216

FOREIGN PATENT DOCUMENTS

| JP | 03-120353 A | 5/1991 |
| JP | 07-97679 A | 4/1995 |
| JP | 07-205362 A | 8/1995 |
| JP | 09-170068 | * 6/1997 |
| JP | 10-317123 | * 12/1998 |
| JP | 11-61380 A | 3/1999 |
| WO | WO-01/016388 A1 | 3/2001 |

* cited by examiner

COATED HARD METAL INSERT

CUTTING EDGE

RAKE FACE

FLANK FACE

US 7,094,479 B2

SURFACE-COATED CUTTING TOOL MEMBER HAVING HARD COATING LAYER EXHIBITING SUPERIOR WEAR RESISTANCE DURING HIGH SPEED CUTTING OPERATION AND METHOD FOR FORMING HARD COATING LAYER ON SURFACE OF CUTTING TOOL

CROSS-REFERENCE TO PRIOR APPLICATION

This is a U.S. national phase application under 35 U.S.C. §371 of International Patent Application No. PCT/JP03/00220 filed Jan. 14, 2003, and claims the benefit of Japanese Patent Application Nos. 2002-11478 filed Jan. 21, 2002; 2002-49893 filed Feb. 26, 2002 and 2002-60208 filed Mar. 6, 2002 which are incorporated by reference herein. The International Application was published in Japanese on Jul. 31, 2003 as WO 03/061884 A1 under PCT Article 21(2).

TECHNICAL FIELD

The present invention relates to a surface-coated cutting tool member (hereinafter referred to as a coated cutting tool) having a hard coating layer exhibiting superior high temperature properties, and thereby exhibiting a superior wear resistance during a high speed cutting operation for various kinds of steels and cast irons in which a significant amount of heat is generated.

Moreover, the present invention relates to a method for forming the above-mentioned hard coating layer on a surface of a cutting tool.

BACKGROUND ART

In general, cutting tools include an indexable insert which is detachably attached to a tip portion of a cutting tool in order to perform a turning or planing operation for a workpiece such as made of various steels or cast irons, a drill or a miniature drill which is used for performing a drilling operation for a workpiece as mentioned above, and a solid type end mill which is used for performing a face milling operation, a groove milling operation, or a shoulder milling operation for a workpiece as mentioned above. In addition, an indexable type end mill is also known, to which an indexable insert is detachably attached for performing a cutting operation as in the case of the solid type end mill.

Furthermore, in order to improve wear resistance, a method is known in which a cutting tool made of a tungsten carbide (hereinafter termed WC) based cemented carbide, a titanium carbonitride (hereinafter termed TiCN) based cermet, or a cubic boron nitride (hereinafter termed c-BN) based sintered material, is accommodated in, for example, an arc ion plating apparatus schematically shown in FIG. 2, which is a type of physical vapor deposition apparatus, an electric current of, for example, 90 A is made to flow as an arc discharge between an anode electrode and a cathode electrode (an evaporation source) to which an Al—Ti alloy having a predetermined composition is attached under the conditions in which the inside of the apparatus is heated to a temperature of, for example, 500° C. using a heater, a nitrogen gas as a reaction gas is introduced into the apparatus so as to prepare a reaction atmosphere at, for example, 2 Pa, and a bias voltage of −100 V is applied to the cutting tool, so that a hard coating layer, which has an average thickness of 1 to 15 µm and is made of a nitride compound (hereinafter termed (Al, Ti)N) layer that includes aluminum and titanium and satisfies a composition formula of $(Al_zTi_{1-z})N$ (where Z indicates an atomic ratio of 0.4 to 0.65), is formed on the surface of the cutting tool.

In recent years, cutting operation apparatuses tend to have significantly high performance, and on the other hand, it is strongly demanded that cutting operations be performed with less power, less energy, and less cost; therefore, cutting operations tend to be performed at high speed. With regard to the above-mentioned conventional cutting tool, no significant problem is encountered when such a tool is used under normal cutting conditions; however, when such a tool is used under high speed cutting conditions in which a significant amount of heat is generated, wear of the hard coating layer of the tool is significantly progressed, which leads to a relatively short operation life.

SUMMARY OF INVENTION

In view of the above circumstances, the inventors have conducted research to develop an (Al, Ti)N layer exhibiting a superior wear resistance during a high speed cutting operation, in particular, by focusing on the (Al, Ti)N layer included in the hard coating layer of the above-mentioned conventional cutting tools, and have obtained the following research results indicated by (a) and (b).

(a) The (Al, Ti)N layer included in the above-mentioned conventional hard coating layer that is formed using the arc ion plating apparatus shown in FIG. 2 exhibits high temperature hardness, heat resistance, and toughness being uniform over the entire thickness of the layer; however, when an (Al, Ti)N layer is formed using an arc ion plating apparatus whose schematic plan view is shown in FIG. 1A and schematic front view is shown in FIG. 1B, i.e., using an arc ion plating apparatus in which a cutting tool supporting turntable is provided at the center thereof, and an Al—Ti alloy as a cathode electrode (an evaporation source) that includes aluminum at a relatively high ratio (i.e., includes titanium at a low ratio) and a Ti—Al alloy as another cathode electrode (an evaporation source) that includes titanium at a relatively high ratio (i.e., includes aluminum at a low ratio) are arranged so as to be opposed to each other while having the turntable therebetween, under the conditions in which the cutting tool is mounted on the turntable at a position radially away from the center axis of the turntable, the reaction atmosphere in the apparatus is made to be a nitrogen atmosphere, the turntable is rotated while the cutting tool itself is simultaneously rotated about the axis thereof in order to make a hard coating layer, which is formed by vapor deposition, to have a uniform thickness, and an arc discharge is generated between the two cathode electrodes (the evaporation sources) and an anode electrode, because, on the surface of the cutting tool, maximum aluminum containing points are formed in a layer at moments at which the cutting tool, which is disposed at a position radially away from the center axis of the turntable, is located at a position closest to the cathode electrode (the evaporation source) of an Al—Ti alloy that includes aluminum at a relatively high ratio (i.e., includes titanium at a low ratio) and minimum aluminum containing points are formed in the layer at moments at which the cutting tool is located at a position closest to the other cathode electrode (the evaporation source) of a Ti—Al alloy that includes titanium at a relatively high ratio (i.e., includes aluminum at a low ratio), the (Al, Ti)N layer exhibits a component concentration profile in which the maximum aluminum containing points and the minimum aluminum containing points appear alternatingly and repeatedly at a predetermined interval in the thickness direction due to the rotation of the turntable, and the amount of contained aluminum (or titanium) is continuously changed from the maximum aluminum containing points to the minimum aluminum containing points and from the minimum aluminum containing points to the maximum aluminum containing points.

(b) Regarding the (Al, Ti)N layer having the repeatedly and continuously changing component concentration profile as mentioned in (a), when, for example, the compositions of the alloys of the opposingly arranged cathode electrodes (the evaporation sources) are adjusted, and the rotational speed of the turntable on which the cutting tools are mounted, so that the maximum aluminum containing points satisfy a composition formula of $(Al_XTi_{1-X})N$ (where X indicates an atomic ratio of 0.70 to 0.95), the minimum aluminum containing points satisfy a composition formula of $(Al_YTi_{1-Y})N$ (where Y indicates an atomic ratio of 0.40 to 0.65), and a distance between one of the maximum aluminum containing points and adjacent one of the minimum aluminum containing points is from 0.01 to 0.1 µm, the maximum aluminum containing points exhibit further superior high temperature hardness and heat resistance (i.e., high temperature properties) since the maximum aluminum containing points include more aluminum than the conventional (Al, Ti)N layer, and on the other hand, the minimum aluminum containing points exhibit high toughness since the minimum aluminum containing points include less aluminum and more titanium than the maximum aluminum containing points. In addition, because the distance between one of the maximum aluminum containing points and adjacent one of the minimum aluminum containing points is set to be very small, the entire layer exhibits superior high temperature properties while ensuring high toughness. Accordingly, the cutting tool having such an (Al, Ti)N layer as a hard coating layer exhibits a superior wear resistance during a high speed cutting operation for various kinds of steels and cast irons in which a significant amount of heat is generated.

The present invention was conceived in view of the aforementioned research results, and provides a surface-coated cutting tool member whose hard coating layer exhibiting a superior wear resistance during a high speed cutting operation, the surface-coated cutting tool member including: a cutting tool substrate; and a hard coating layer of an (Al, Ti)N, which is formed on a surface of the substrate using a physical vapor deposition method at an overall average thickness of 1 to 15 µm, wherein the hard coating layer has a component concentration profile in which maximum aluminum containing points (minimum titanium containing points) and minimum aluminum containing points (maximum titanium containing points) appear alternatingly and repeatedly at a predetermined interval in a direction of thickness of the hard coating layer, and the amount of contained aluminum (or titanium) is continuously changed from the maximum aluminum containing points to the minimum aluminum containing points and from the minimum aluminum containing points to the maximum aluminum containing points, the maximum aluminum containing points satisfy a composition formula of $(Al_XTi_{1-X})N$ (where X indicates an atomic ratio of 0.70 to 0.95), the minimum aluminum containing points satisfy a composition formula of $(Al_YTi_{1-Y})N$ (where Y indicates an atomic ratio of 0.40 to 0.65), and a distance between one of the maximum aluminum containing points and an adjacent one of the minimum aluminum containing points is from 0.01 to 0.1 µm.

The present invention also provides a method for forming a hard coating layer exhibiting a superior wear resistance during a high speed cutting operation on a surface of a cutting tool. The method includes: mounting the cutting tool of a WC based cemented carbide and/or a TiCN based cermet and/or a c-BN based sintered material on a turntable housed in an arc ion plating apparatus at a position radially away from a center axis of the turntable in a manner rotatable about an axis of the cutting tool; producing a nitrogen gas atmosphere as the reaction atmosphere in the arc ion plating apparatus; and generating arc discharge between a cathode electrode of an Al—Ti alloy for forming maximum aluminum containing points (minimum titanium containing points) and an anode electrode, and between another cathode electrode of a Ti—Al alloy for forming minimum aluminum containing points (maximum titanium containing points), which is disposed so as to oppose to the cathode electrode of an Al—Ti alloy with respect to the turntable, and another anode electrode, so that a hard coating layer having overall average thickness of 1 to 15 µm is formed, by a physical vapor deposition method, on the surface of the cutting tool being turned while rotating on the turntable about an axis of the cutting tool, wherein the hard coating layer has a component concentration profile in which the maximum aluminum containing points (the minimum titanium containing points) and the minimum aluminum containing points (the maximum titanium containing points) appear alternatingly and repeatedly at a predetermined interval in a direction of thickness of the hard coating layer, and the amount of contained aluminum (or titanium) is continuously changed from the maximum aluminum containing points to the minimum aluminum containing points and from the minimum aluminum containing points to the maximum aluminum containing points, the maximum aluminum containing points satisfy a composition formula of $(Al_XTi_{1-X})N$ (where X indicates an atomic ratio of 0.70 to 0.95), the minimum aluminum containing points satisfy a composition formula of $(Al_YTi_{1-Y})N$ (where Y indicates an atomic ratio of 0.40 to 0.65), and a distance between one of the maximum aluminum containing points and adjacent one of the minimum aluminum containing points is from 0.01 to 0.1 µm.

Next, the reason the structure of the hard coating layer of the present invention is embodied limited as described above will be explained below.

(a) Composition of the Maximum Aluminum Containing Points

Aluminum is included in the (Al, Ti)N layer of the hard coating layer in order to improve high temperature hardness and heat resistance (i.e., high temperature properties) of the TiN layer having high toughness; therefore, when the ratio (atomic ratio: X) of aluminum with respect to a total amount of aluminum and titanium is less than 0.70, desired superior high temperature properties cannot be obtained, and on the other hand, when the ratio is greater than 0.95, toughness is significantly reduced due to low ratio of titanium, and a cutting edge tends to easily be chipped (small fracturing). Accordingly, the ratio was set from 0.70 to 0.95.

(b) Composition of the Minimum Aluminum Containing Points

As explained above, the maximum aluminum containing points exhibit superior high temperature properties; however, in contrast, exhibit inferior toughness; therefore, in order to improve toughness of the maximum aluminum containing points, the minimum aluminum containing points, which include titanium at a high ratio and exhibit high toughness, are alternatingly interposed in the thickness direction. When the ratio (atomic ratio: Y) of titanium with respect to a total amount of aluminum and titanium is greater than 0.65, a desired superior toughness cannot be obtained, and on the other hand, when the ratio is less than 0.40, the minimum aluminum containing points cannot have desired superior high temperature properties because a relative ratio of titanium is too high. Accordingly, the ratio was set from 0.40 to 0.65.

(c) Distance Between the Maximum Aluminum Containing Point and the Minimum Aluminum Containing Point The distance between the maximum aluminum containing point and the minimum aluminum containing point was set from 0.01 to 0.1 μm because when the distance is less than 0.01 μm, it is difficult to form each of the points so as to have the aforementioned composition, and when the distance is greater than 0.1 μm, weaknesses at each of the points, i.e., insufficient toughness in the case of the maximum aluminum containing point, and insufficient high temperature properties in the case of the minimum aluminum containing point, will locally appear in the layer, which may lead to chipping in the cutting edge or excessive wear.

(d) Overall Average Thickness of the Hard Coating Layer

The average thickness was set from 1 to 15 μm because when the thickness of the layer is less than 1 μm, a desired wear resistance cannot be ensured, and in contrast, when the average thickness is greater than 15 μm, the cutting edge tends to be chipped.

BRIEF DESCRIPTION OF THE DRAWINGS

FIG. 1A is a schematic plan view, and FIG. B is a schematic front view.

BEST MODE FOR CARRYING OUT THE INVENTION

Figure 1A:
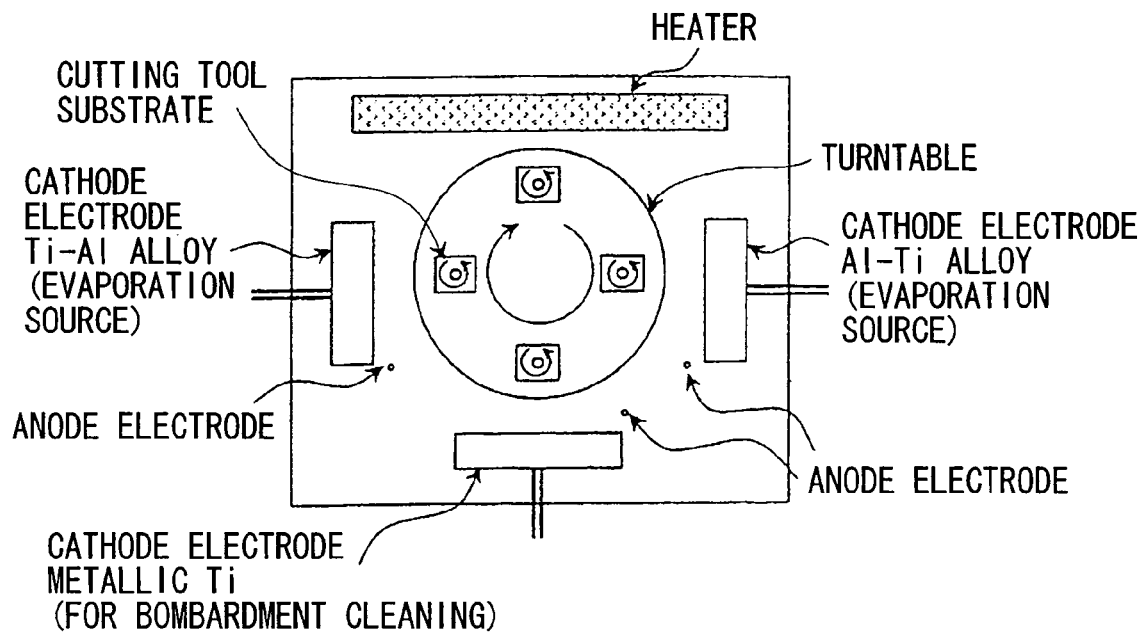
FIGS. 1A and 1B show an arc ion plating apparatus that is used for forming a hard coating layer included in a coated cutting tool of the present invention, in particular.

Next, the coated cutting tools of the present invention will be explained in detail with Embodiments.

Embodiment 1

First, ingredient powders, i.e., powders of WC, TiC, ZrC, VC, TaC, NbC, $Cr_3C_2$, TiN, TaN, and Co, all of which have an average grain size in a range from 1 to 3 μm, were prepared and mixed in accordance with blending ratios shown in TABLE 1. The ingredient powders were mixed under wet conditions using a ball mill for 72 hours, were dried, and were compacted under pressure of 100 MPa so as to form green compacts. The green compacts were held in a vacuum of 6 Pa at a temperature of 1400° C. for 1 hour so as to be sintered. After sintering, a honing process, in which a radius is set to be 0.03, is applied to cutting edge portions of each of the sintered compacts so as to obtain hard metal substrates A-1 to A-10 of WC based hard metal, each of which had an insert shape defined as CNMG120408 in the ISO standard.

Furthermore, ingredient powders, i.e., powders of TiCN (TiC/TiN=50/50 when expressed by weight ratio), $Mo_2C$, ZrC, NbC, TaC, WC, Co, and Ni, all of which had an average grain size in a range from 0.5 to 2 μm, were prepared and mixed in accordance with blending ratios shown in TABLE 2. The ingredient powders were mixed under wet conditions using a ball mill for 24 hours, were dried, and were compacted under pressure of 100 MPa so as to form green compacts. Among the green compacts, the green compacts for forming hard metal substrates B-1 to B-6 were held in a nitrogen atmosphere of 2 kPa, and at a temperature of 1500° C. for 1 hour, and were cooled in an oven so as to be sintered. On the other hand, the green compacts for forming hard metal substrates B-7 to B-9 were held in a vacuum of 1 Pa while increasing temperature from room temperature to 1300° C., in a nitrogen atmosphere of 1 kPa while increasing temperature from 1300° C. to 1350° C., in a vacuum of 1 Pa while increasing temperature from 1350° C. to 1400° C., in a nitrogen atmosphere of 2 kPa while increasing temperature from 1400° C. to 1450° C., and in a vacuum of 1 Pa while increasing temperature from 1450° C. to 1500° C. After reaching a sintering temperature of 1500° C., the green compacts were held in a nitrogen atmosphere of 3 kPa for 1 hour, and were cooled in the oven so as to be sintered. After sintering, a honing process, in which a radius is set to be 0.03, is applied to cutting edge portions of each of the sintered compacts so as to obtain hard metal substrates B-1 to B-9 of TiCN cermet, each of which had an insert shape defined as CNMG120408 in the ISO standard.

The longitudinal cross-section of each of the hard metal substrates B-1 to B-9 was observed using a scanning electron microscope. As a result, the hard metal substrates B-1 to B-6 exhibited a two-phase structure including a hard phase, which is uniform from the surface to the interior, and which made of carbonitride compounds including titanium and at least one of Zr, Ta, Nb, Mo, and W, and a bonded phase having Co and Ni as primary components. On the other hand, the hard metal substrates B-7 to B-9 exhibited the same structure as the aforementioned two-phase structure in the interior; however, a surface layer in which the bonded phase did not exist over a depth of 1 to 3 μm from the surface, i.e., a surface layer consisting of the carbonitride compound, was observed in a superficial portion.

Figure 1B:
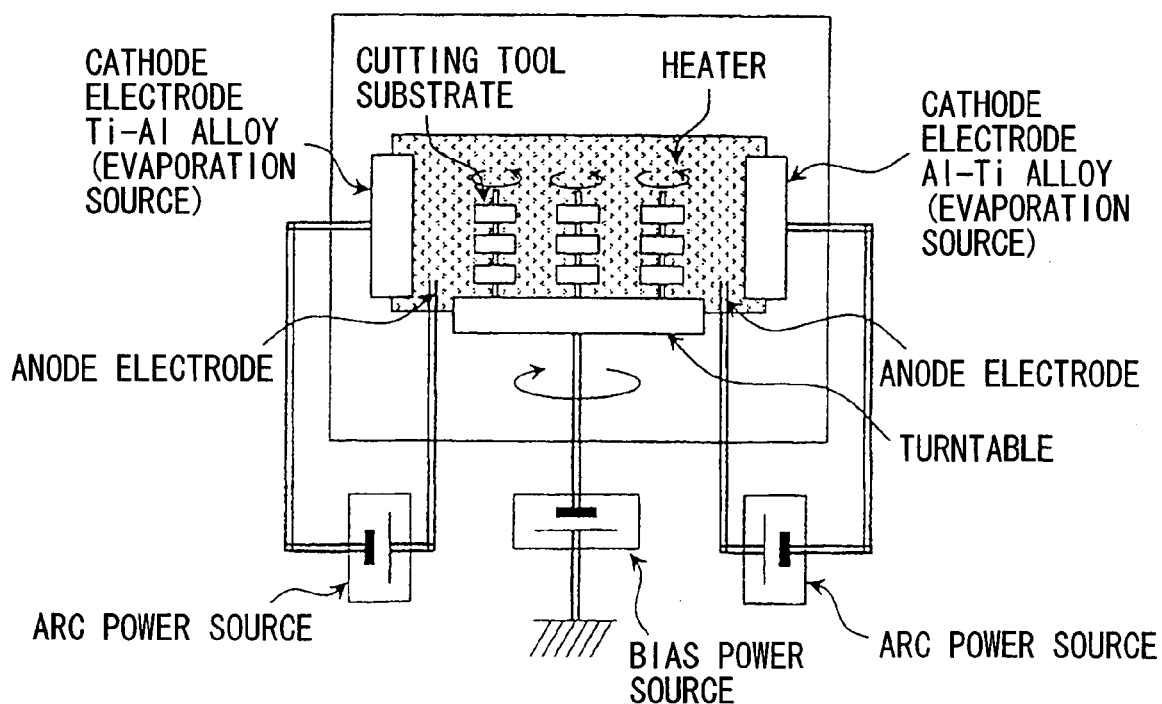
Figure 3A:
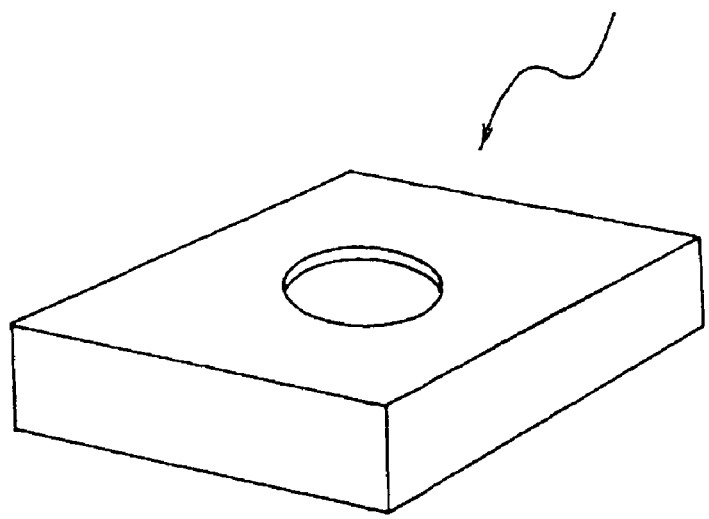
FIG. 3A is a schematic perspective view showing a coated hard metal insert.
Figure 3B:
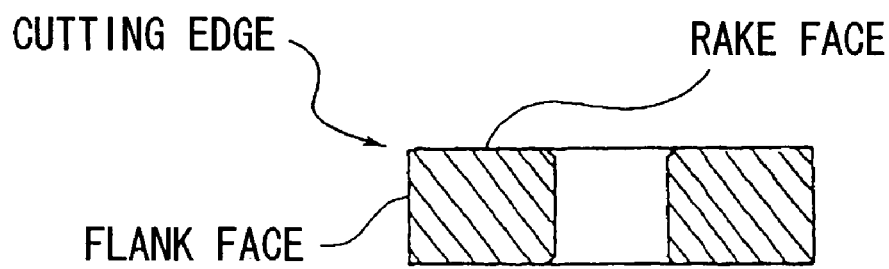
FIG. 3B is a schematic longitudinal cross-sectional view showing the coated hard metal insert.

Next, the aforementioned hard metal substrates A-1 to A-10 and B-1 to B-9 were subjected to ultrasonic cleaning in an acetone solvent, were dried, and were mounted on a turntable housed in an arc ion plating apparatus shown in FIGS. 1A and 1B at positions radially away from a center axis of the turntable in a manner rotatable about respective axes of the hard metal substrates. In the arc ion plating apparatus, a Ti—Al alloy having various components for forming minimum aluminum containing points was set as a cathode electrode (evaporation source), an Al—Ti alloy having various components for forming maximum aluminum containing points was set as another cathode electrode (evaporation source) so as to oppose to the cathode electrode of a Ti—Al alloy while having the turntable therebetween, and metallic titanium for bombardment cleaning is also set. The inside of the apparatus was evacuated and maintained at a vacuum at a pressure of 0.5 Pa or less, and the inside of the apparatus was heated to a temperature of 500° C. using a heater. Then, a DC bias voltage of −1000 V was applied to the hard metal substrates which are turned while rotating on the turntable about the respective axes thereof, and an electric current of 100 A was made flow as an arc discharge between the cathode electrode, i.e., metallic titanium, and an anode electrode, so that the surfaces of the hard metal substrates were subjected to Ti bombardment cleaning. Next, a nitrogen gas, as a reaction gas, was introduced into the apparatus so as to prepare a reaction atmosphere at a pressure of 2 Pa, a DC bias voltage of −100 V was applied to the hard metal substrates which are turned while rotating on the turntable about the respective axes thereof, and an electric current of 100 A was made to flow as an arc discharge between the cathode electrodes (the Ti—Al alloy for forming the minimum aluminum containing points and the Al—Ti alloy for forming the maximum aluminum containing points) and the anode electrodes, respectively, so that the method of the present invention was carried out by which a hard coating layer, which had component concentration profile in which the minimum aluminum containing points and the maximum aluminum containing points having a designated composition shown in TABLES 3 and 4 appear alternatingly and repeatedly at a designated interval also shown in TABLES 3 and 4 in the thickness direction, and the amount of contained aluminum (or titanium) is continuously changed from the maximum aluminum containing points to the minimum aluminum containing points and from the minimum aluminum containing points to the maximum aluminum containing points, and which had a designated overall layer thickness also shown in TABLES 3 and 4, was formed, by a vapor deposition method, on the surface of each of the hard metal substrates, and thereby surface-coated hard metal indexable inserts 1 to 19 of the present invention (hereinafter referred to as coated hard metal inserts of the present invention) having a shape whose schematic perspective view is shown in FIG. 3A, and whose schematic longitudinal cross-sectional view is shown in FIG. 3B, as the coated cutting tools of the present invention, were fabricated.

Figure 2:
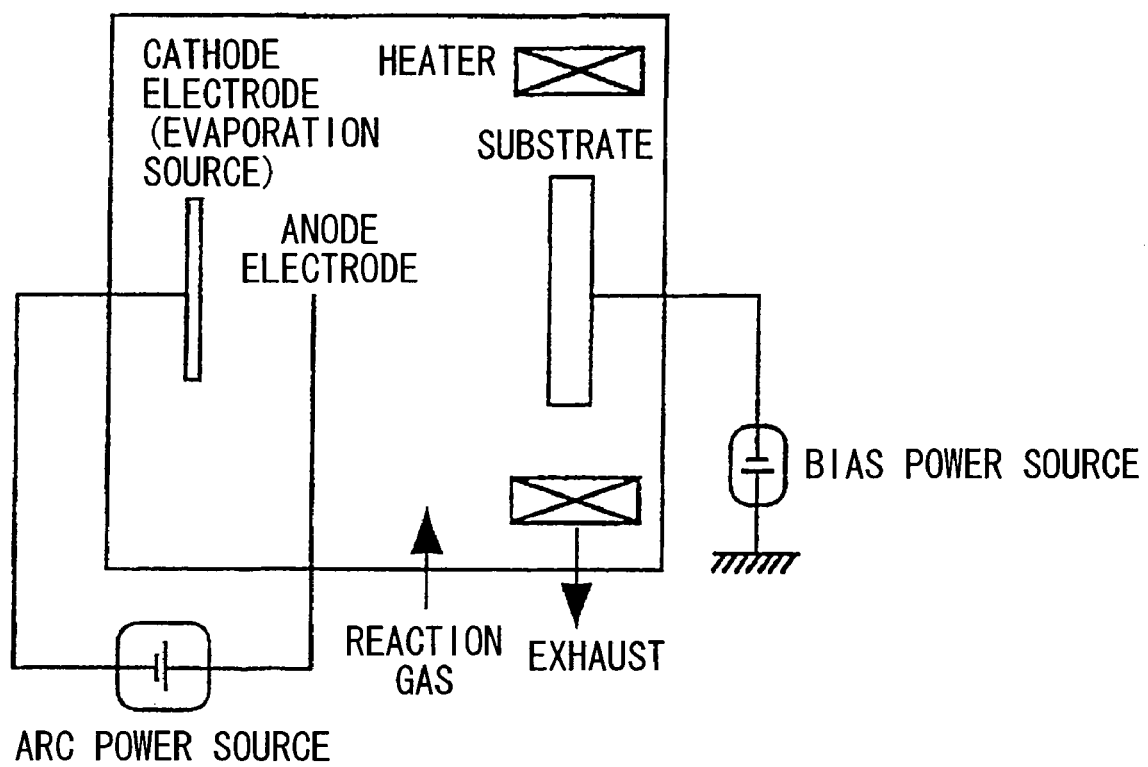
FIG. 2 is a schematic diagram showing a normal arc ion plating apparatus that is used for forming a hard coating layer included in a conventional coated cutting tool.

For the purpose of comparison, the hard metal substrates A-1 to A-10 and B-1 to B-9 were subjected to ultrasonic cleaning in acetone, were dried, and were accommodated in a conventional arc ion plating apparatus shown in FIG. 2. In the arc ion plating apparatus, an Al—Ti alloy having various components was set as a cathode electrode (evaporation source), the inside of the apparatus was evacuated and maintained at a vacuum at a pressure of 0.5 Pa or less, the inside of the apparatus was heated to a temperature of 500° C. using a heater, and an argon gas was introduced into the apparatus so as to prepare an argon atmosphere at a pressure of 10 Pa. Then, a bias voltage of −800 V was applied to the hard metal substrates so that the surfaces of the hard metal substrates were subjected to argon gas bombardment cleaning. Next, a nitrogen gas, as a reaction gas, was introduced into the apparatus so as to prepare a reaction atmosphere at a pressure of 2 Pa, the bias voltage applied to the hard metal substrates was decreased to −100 V, and an electric current was made to flow as an arc discharge between the cathode electrode and the anode electrode so that a conventional method was carried out by which a hard coating layer, which had a designated composition and a designated layer thickness shown in TABLES 5 and 6, and which included an (Al, Ti)N layer in which composition was substantially constant in the direction of the layer thickness, was formed, by a vapor deposition method, on the surface of each of the hard metal substrates A-1 to A-10 and B-1 to B-9, and thereby conventional surface-coated hard metal indexable inserts 1 to 19 (hereinafter referred to as conventional coated hard metal inserts) also having a shape shown in FIGS. 3A and 3B, as conventional coated cutting tools, were fabricated.

Next, the coated hard metal inserts 1 to 19 of the present invention and the conventional coated hard metal inserts 1 to 19 were subjected to cutting tests by attaching each of them to a tip portion of a cutting tool made of tool steel using a fixing bridge and a screw. The detailed test conditions were set as follows:

with regard to high-speed, dry, and continuous turning tests in which workpieces of alloy steel were machined, workpiece: a circular bar of SNCM439 defined in the JIS, cutting speed: 300 m/min, depth of cut: 0.15 mm, feed: 0.2 mm/rev, time: 10 min;

with regard to high-speed, dry, and interrupted turning tests in which workpieces of carbon steel were machined, workpiece: a circular bar with four evenly distributed longitudinal grooves made of S50C defined in the JIS, cutting speed: 300 m/min, depth of cut: 1.5 mm, feed: 0.25 mm/rev, time: 10 min; and with regard to high-speed, dry, and interrupted turning tests in which workpieces of cast iron were machined, workpiece: a circular bar with four evenly distributed longitudinal grooves made of FC300 defined in the JIS, cutting speed: 300 m/min, depth of cut: 1.0 mm, feed: 0.25 mm/rev, time: 10 min.

In each of the turning tests, flank wear width width of the cutting edge was measured. The test results are shown in TABLES 3 to 6.

TABLE 1

| | | Blending ratio (wt %) | | | | | | |
|---|---|---|---|---|---|---|---|---|
| Classification | | Co | TiC | TaC | NbC | VC | Cr$_3$C$_2$ | WC |
| Hard metal substrate (Insert) | A-1 | 5 | 2 | — | — | — | — | Balance |
| | A-2 | 6 | — | 1.5 | 1 | — | — | Balance |
| | A-3 | 6.5 | 0.6 | — | — | — | — | Balance |
| | A-4 | 7 | 0.4 | — | 1 | — | — | Balance |
| | A-5 | 8 | — | — | — | 1 | 0.3 | Balance |
| | A-6 | 8.5 | — | 2.5 | — | — | — | Balance |
| | A-7 | 9.5 | — | — | — | — | 0.5 | Balance |
| | A-8 | 10.5 | 5 | — | 2 | — | — | Balance |
| | A-9 | 12 | 0.6 | 2.5 | — | — | — | Balance |
| | A-10 | 12.5 | 1.5 | — | — | — | — | Balance |

TABLE 2

| | | Blending ratio (wt %) | | | | | | | |
|---|---|---|---|---|---|---|---|---|---|
| Classification | | Co | Ni | ZrC | TaC | NbC | MO$_2$C | WC | TiCN |
| Hard metal substrate (Insert) | B-1 | 13 | 5 | — | 10 | — | 10 | 16 | Balance |
| | B-2 | 8 | 7 | — | 5 | — | 7.5 | — | Balance |
| | B-3 | 5 | — | — | — | — | 6 | 10 | Balance |
| | B-4 | 10 | 5 | — | 11 | 2 | — | — | Balance |
| | B-5 | 9 | 4 | 1 | 8 | — | 10 | 10 | Balance |
| | B-6 | 12 | 5.5 | — | 10 | — | 9.5 | 14.5 | Balance |
| | B-7 | 15 | 5 | 0.5 | 3 | 10 | — | 22 | Balance |
| | B-8 | 12 | 3 | — | 10 | 2 | 5 | — | Balance |
| | B-9 | — | 9 | 0.3 | 5 | — | — | 10 | Balance |

TABLE 3

| Classification | | Symbols of hard metal substrate | Hard coating layer | | | | | | Designated distance between two points (μm) | Designated overall layer thickness (μm) | Flank wear width (mm) | | |
|---|---|---|---|---|---|---|---|---|---|---|---|---|---|
| | | | Maximum Al containing points Designated composition (atomic ratio) | | | Minimum Al containing points Designated composition (atomic ratio) | | | | | Continuous high speed cutting of alloy steel | Interrupted high speed cutting of carbon steel | Interrupted high speed cutting of cast iron |
| | | | Al | Ti | N | Al | Ti | N | | | | | |
| Coated hard metal insert of the present invention | 1 | A-1 | 0.80 | 0.20 | 1.00 | 0.60 | 0.40 | 1.00 | 0.08 | 3 | 0.14 | 0.14 | 0.17 |
| | 2 | A-2 | 0.90 | 0.10 | 1.00 | 0.65 | 0.35 | 1.00 | 0.1 | 15 | 0.18 | 0.20 | 0.22 |
| | 3 | A-3 | 0.85 | 0.15 | 1.00 | 0.50 | 0.50 | 1.00 | 0.06 | 7 | 0.14 | 0.13 | 0.18 |
| | 4 | A-4 | 0.95 | 0.05 | 1.00 | 0.40 | 0.60 | 1.00 | 0.05 | 1 | 0.21 | 0.20 | 0.25 |
| | 5 | A-5 | 0.70 | 0.30 | 1.00 | 0.45 | 0.55 | 1.00 | 0.01 | 2 | 0.20 | 0.21 | 0.24 |
| | 6 | A-6 | 0.75 | 0.25 | 1.00 | 0.55 | 0.45 | 1.00 | 0.1 | 5 | 0.13 | 0.14 | 0.18 |
| | 7 | A-7 | 0.80 | 0.20 | 1.00 | 0.40 | 0.60 | 1.00 | 0.03 | 12 | 0.19 | 0.20 | 0.23 |
| | 8 | A-8 | 0.75 | 0.25 | 1.00 | 0.45 | 0.55 | 1.00 | 0.05 | 9 | 0.17 | 0.18 | 0.22 |
| | 9 | A-9 | 0.90 | 0.10 | 1.00 | 0.60 | 0.40 | 1.00 | 0.04 | 6 | 0.18 | 0.19 | 0.24 |
| | 10 | A-10 | 0.70 | 0.30 | 1.00 | 0.55 | 0.45 | 1.00 | 0.02 | 3 | 0.19 | 0.18 | 0.23 |

TABLE 4

| Classification | | Symbols of hard metal substrate | Hard coating layer | | | | | | Designated distance between two points (μm) | Designated overall layer thickness (μm) | Flank wear width (mm) | | |
|---|---|---|---|---|---|---|---|---|---|---|---|---|---|
| | | | Maximum Al containing points Designated composition (atomic ratio) | | | Minimum Al containing points Designated composition (atomic ratio) | | | | | Continuous high speed cutting of alloy steel | Interrupted high speed cutting of carbon steel | Interrupted high speed cutting of cast iron |
| | | | Al | Ti | N | Al | Ti | N | | | | | |
| Coated hard metal insert of the present invention | 11 | B-1 | 0.80 | 0.20 | 1.00 | 0.60 | 0.40 | 1.00 | 0.08 | 3 | 0.13 | 0.14 | 0.16 |
| | 12 | B-2 | 0.90 | 0.10 | 1.00 | 0.65 | 0.35 | 1.00 | 0.1 | 15 | 0.18 | 0.21 | 0.23 |
| | 13 | B-3 | 0.85 | 0.15 | 1.00 | 0.50 | 0.50 | 1.00 | 0.06 | 7 | 0.13 | 0.12 | 0.18 |
| | 14 | B-4 | 0.95 | 0.05 | 1.00 | 0.40 | 0.60 | 1.00 | 0.05 | 1 | 0.20 | 0.22 | 0.24 |
| | 15 | B-5 | 0.70 | 0.30 | 1.00 | 0.45 | 0.55 | 1.00 | 0.01 | 2 | 0.19 | 0.21 | 0.25 |
| | 16 | B-6 | 0.75 | 0.25 | 1.00 | 0.55 | 0.45 | 1.00 | 0.1 | 5 | 0.13 | 0.13 | 0.17 |
| | 17 | B-7 | 0.80 | 0.20 | 1.00 | 0.40 | 0.60 | 1.00 | 0.03 | 12 | 0.19 | 0.19 | 0.22 |
| | 18 | B-8 | 0.75 | 0.25 | 1.00 | 0.45 | 0.55 | 1.00 | 0.05 | 9 | 0.16 | 0.18 | 0.23 |
| | 19 | B-9 | 0.90 | 0.10 | 1.00 | 0.65 | 0.40 | 1.00 | 0.04 | 6 | 0.17 | 0.20 | 0.24 |

TABLE 5

| Classification | | Symbols of hard metal substrate | Hard coating layer | | | Designated layer thickness (μm) | Flank wear width (mm) | | |
|---|---|---|---|---|---|---|---|---|---|
| | | | Designated composition (atomic ratio) | | | | Continuous high speed cutting of alloy steel | Interrupted high speed cutting of carbon steel | Interrupted high speed cutting of cast iron |
| | | | Al | Ti | N | | | | |
| Conventional coated hard metal insert | 1 | A-1 | 0.60 | 0.40 | 1.00 | 3 | 0.36 | 0.37 | 0.43 |
| | 2 | A-2 | 0.65 | 0.35 | 1.00 | 15 | 0.34 | 0.35 | 0.42 |
| | 3 | A-3 | 0.50 | 0.50 | 1.00 | 7 | 0.35 | 0.35 | 0.42 |
| | 4 | A-4 | 0.40 | 0.60 | 1.00 | 1 | 0.38 | 0.38 | 0.44 |
| | 5 | A-5 | 0.45 | 0.55 | 1.00 | 2 | 0.37 | 0.38 | 0.42 |
| | 6 | A-6 | 0.55 | 0.45 | 1.00 | 5 | 0.37 | 0.36 | 0.45 |
| | 7 | A-7 | 0.40 | 0.60 | 1.00 | 12 | 0.35 | 0.36 | 0.44 |
| | 8 | A-8 | 0.45 | 0.55 | 1.00 | 9 | 0.35 | 0.35 | 0.44 |
| | 9 | A-9 | 0.60 | 0.40 | 1.00 | 6 | 0.37 | 0.38 | 0.42 |
| | 10 | A-10 | 0.55 | 0.45 | 1.00 | 3 | 0.36 | 0.37 | 0.44 |

TABLE 6

| Classification | | Symbols of hard metal substrate | Hard coating layer | | | Flank wear width (mm) | | |
|---|---|---|---|---|---|---|---|---|
| | | | Designated composition (atomic ratio) | | | Designated layer thickness | Continuous high speed cutting of | Interrupted high speed cutting of | Interrupted high speed cutting of |
| | | | Al | Ti | N | (μm) | alloy steel | carbon steel | cast iron |
| Conventional coated hard metal insert | 11 | B-1 | 0.60 | 0.40 | 1.00 | 3 | 0.35 | 0.33 | 0.41 |
| | 12 | B-2 | 0.65 | 0.35 | 1.00 | 15 | 0.33 | 0.33 | 0.41 |
| | 13 | B-3 | 0.50 | 0.50 | 1.00 | 7 | 0.35 | 0.35 | 0.42 |
| | 14 | B-4 | 0.40 | 0.60 | 1.00 | 1 | 0.36 | 0.37 | 0.43 |
| | 15 | B-5 | 0.45 | 0.55 | 1.00 | 2 | 0.37 | 0.36 | 0.44 |
| | 16 | B-6 | 0.55 | 0.45 | 1.00 | 5 | 0.36 | 0.34 | 0.44 |
| | 17 | B-7 | 0.40 | 0.60 | 1.00 | 12 | 0.34 | 0.35 | 0.43 |
| | 18 | B-8 | 0.45 | 0.55 | 1.00 | 9 | 0.34 | 0.34 | 0.43 |
| | 19 | B-9 | 0.60 | 0.40 | 1.00 | 6 | 0.37 | 0.37 | 0.41 |

Embodiment 2

Ingredient powders, i.e., medium coarse powder of WC having an average grain size of 5.5 μm, fine powder of WC having an average grain size of 0.8 μm, powder of TaC having an average grain size of 1.3 μm, powder of NbC having an average grain size of 1.2 μm, powder of ZrC having an average grain size of 1.2 μm, powder of $Cr_3C_2$ having an average grain size of 2.3 μm, powder of VC having an average grain size of 1.5 μm, powder of (Ti, W)C having an average grain size of 1.0 μm, and powder of Co having an average grain size of 1.8 μm, were prepared. The ingredient powders were blended according to the blending ratios shown in TABLE 7, were mixed in acetone after adding wax for 24 hours using a ball mill, were subjected to depressurized drying, and were compacted under a pressure of 100 MPa so as to obtain various green compacts having predetermined shapes. The green compacts were held in a vacuum of 6 Pa while increasing temperature from 1370° C. to 1470° C. at a temperature increasing rate of 7° C./min, were further held at this temperature for 1 hour, and were cooled in the an oven so as to be sintered and so as to obtain sintered circular bars for forming three types of hard metal substrates, each type having one of diameters of 8 mm, 13 mm, and 26 mm. The three types of hard metal substrates were subjected to grinding so as to obtain hard metal substrates (end mill) C-1 to C-8, each of which has cutting edges dimensionally defined by one of combinations of diameter and length (diameter×length), i.e., one of 6 mm×13 mm, 10 mm×22 mm, and 20 mm×45 mm, as shown in TABLE 7.

Figure 4A:
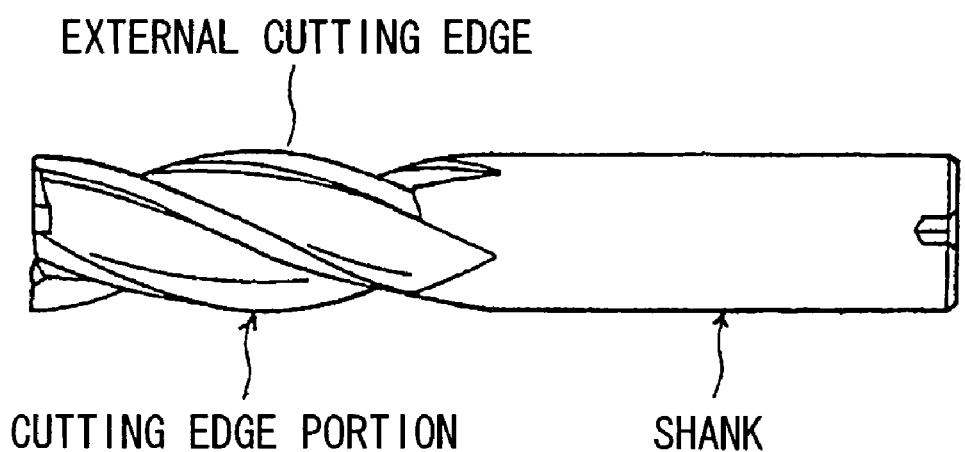
FIG. 4A is a schematic front view showing a coated hard metal end mill.
Figure 4B:
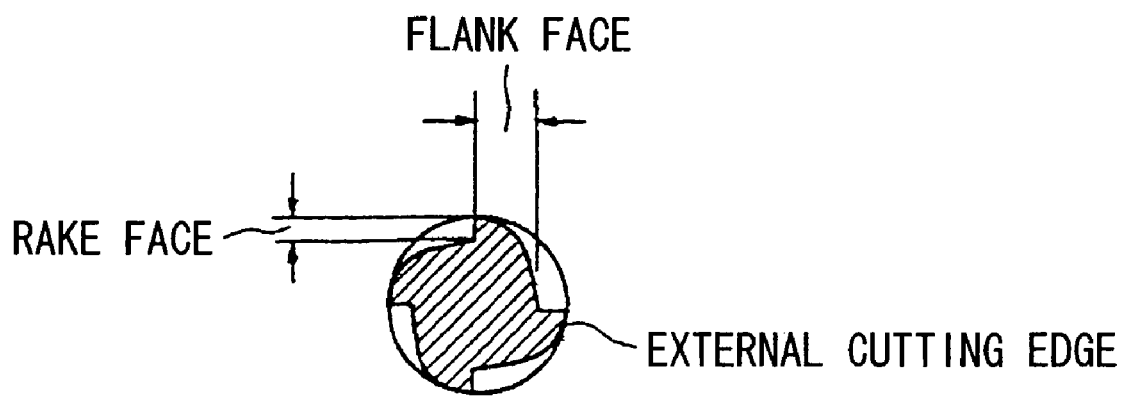
FIG. 4B is a schematic transverse cross-sectional view showing cutting edges of the end mill.

Next, the surfaces of the hard metal substrates (end mill) C-1 to C-8 were subjected to ultrasonic cleaning in acetone, and then the hard metal substrates C-1 to C-8 were dried, and were accommodated in the arc ion plating apparatus shown in FIGS. 1A and 1B, and then the method of the present invention was carried out under the same conditions as in the Embodiment 1 by which a hard coating layer, which had component concentration profile in which the minimum aluminum containing points and the maximum aluminum containing points having a designated composition shown in TABLE 8 appear alternatingly and repeatedly at a designated interval also shown in TABLE 8 in the thickness direction, and the amount of contained aluminum (or titanium) is continuously changed from the maximum aluminum containing points to the minimum aluminum containing points and from the minimum aluminum containing points to the maximum aluminum containing points, and which had a designated overall layer thickness also shown in TABLE 8, was formed by a vapor deposition method, and thereby surface-coated hard metal end mills 1 to 8 of the present invention (hereinafter referred to as coated hard metal end mills of the present invention) having a shape whose schematic front view is shown in FIG. 4A, and whose schematic transverse cross-sectional view, specifically at the cutting edge, is shown in FIG. 4B, as the coated cutting tools of the present invention, were fabricated.

For the purpose of comparison, the surfaces of the hard metal substrates (end mills) C-1 to C-8 were subjected to ultrasonic cleaning in acetone, and then the hard metal substrates C-1 to C-8 were dried, and were accommodated in a conventional arc ion plating apparatus shown in FIG. 2. The conventional method was carried out under the same conditions as in the Embodiment 1 by which a hard coating layer, which had a designated composition and a designated layer thickness shown in TABLE 9, and which included an (Al, Ti)N layer in which composition was substantially constant in the direction of the layer thickness, was formed by a vapor deposition method, and thereby conventional surface-coated hard metal end mills 1 to 8 (hereinafter referred to as conventional coated hard metal end mills), as conventional coated cutting tools, were fabricated.

Next, among the coated hard metal end mills 1 to 8 of the present invention and the conventional coated hard metal end mills 1 to 8, the coated hard metal end mills 1 to 3 of the present invention and the conventional coated hard metal end mills 1 to 3 were subjected to dry, high-speed, and groove formation cutting tests in which workpieces of tool steel were machined under the following conditions, workpiece: a plate of SKD61 defined in the JIS having a plane size of 100 mm×250 mm,
and a thickness of 50 mm,
cutting speed: 180 m/min,
depth of groove (depth of cut): 2 mm, and
table feed: 850 mm/min.

The coated hard metal end mills 4 to 6 of the present invention and the conventional coated hard metal end mills 4 to 6 were subjected to dry, high-speed, and groove formation cutting tests in which workpieces of stainless steel were machined under the following conditions, workpiece: a plate of SUS316 defined in the JIS having a plane size of 100 mm×250 mm,
and a thickness of 50 mm,
cutting speed: 160 m/min,
depth of groove (depth of cut): 3 mm, and
table feed: 800 mm/min.

The coated hard metal end mills 7 and 8 of the present invention and the conventional coated hard metal end mills 7 and 8 were subjected to dry, high-speed, and groove formation cutting tests in which workpieces of alloy steel were machined under the following conditions,
workpiece: a plate of SCM440 defined in the JIS having a plane size of 100 mm×250 mm, and a thickness of 50 mm,
cutting speed: 300 m/min,
depth of groove (depth of cut): 6 mm, and
table feed: 850 mm/min.

In each of the groove formation cutting tests, a groove was formed until flank wear width of the external cutting edge of the cutting edge portion reached 0.1 mm, which indicates that the tool life has ended, and the length of cut groove was measured. The test results are shown in TABLES 8 and 9.

Embodiment 3

The three types of sintered bars, i.e., the bars having a diameter of 8 mm (hard metal substrates C-1 to C-3), the bars having a diameter of 13 mm (hard metal substrates C-4 to C-6), and the bars having a diameter of 26 mm (hard metal substrates C-7 and C-8), fabricated in Embodiment 2 were subjected to grinding so as to obtain hard metal substrates (drills) D-1 to D-8, and more specifically, to obtain hard metal substrates D-1 to D-3 having a fluted portion size of 4 mm×13 mm (diameter×length), hard metal substrates D-4 to D-6 having a fluted portion size of 8 mm×22 mm, and hard metal substrates D-7 and D-8 having a fluted portion size of 16 mm×45 mm.

Next, honing processes were applied to the cutting edges of the hard metal substrates (drills) D-1 to D-8, the hard metal substrates D-1 to D-8 were subjected to ultrasonic

TABLE 7

| Classification | | Co | (Ti,W)C | TaC | NbC | ZrC | $Cr_3C_2$ | VC | WC | Diameter × length of cutting edge (mm) |
|---|---|---|---|---|---|---|---|---|---|---|
| Hard metal substrate (end mill) | C-1 | 5 | 5 | — | — | — | — | — | Medium coarse grain: Balance | 6 × 13 |
| | C-2 | 6 | — | 1 | 0.5 | — | — | — | Fine grain: Balance | 6 × 13 |
| | C-3 | 6 | — | 1 | — | 1 | 0.5 | 0.5 | Fine grain: Balance | 6 × 13 |
| | C-4 | 8 | — | — | — | — | 0.5 | 0.5 | Fine grain: Balance | 10 × 22 |
| | C-5 | 9 | 25 | 10 | 1 | — | — | — | Medium coarse grain: Balance | 10 × 22 |
| | C-6 | 10 | — | — | — | — | 1 | — | Fine grain: Balance | 10 × 22 |
| | C-7 | 12 | 17 | 9 | 1 | — | — | — | Medium coarse grain: Balance | 20 × 45 |
| | C-8 | 16 | — | 10 | 5 | 10 | — | — | Medium coarse grain: Balance | 20 × 45 |

TABLE 8

| | | | Hard coating layer | | | | | | | |
|---|---|---|---|---|---|---|---|---|---|---|
| | | Symbols of hard metal | Maximum Al containing points Designated composition (atomic ratio) | | | Minimum Al containing points Designated composition (atomic ratio) | | | Designated distance between two points | Designated overall layer thickness | Length of cut |
| Classification | | substrate | Al | Ti | N | Al | Ti | N | (μm) | (μm) | groove (m) |
| Coated hard metal end mill of the present invention | 1 | C-1 | 0.80 | 0.20 | 1.00 | 0.60 | 0.40 | 1.00 | 0.08 | 3 | 100 |
| | 2 | C-2 | 0.90 | 0.10 | 1.00 | 0.65 | 0.35 | 1.00 | 0.1 | 7 | 85 |
| | 3 | C-3 | 0.85 | 0.15 | 1.00 | 0.50 | 0.50 | 1.00 | 0.06 | 5 | 105 |
| | 4 | C-4 | 0.95 | 0.05 | 1.00 | 0.40 | 0.60 | 1.00 | 0.05 | 1 | 85 |
| | 5 | C-5 | 0.70 | 0.30 | 1.00 | 0.45 | 0.55 | 1.00 | 0.01 | 2 | 80 |
| | 6 | C-6 | 0.75 | 0.25 | 1.00 | 0.55 | 0.45 | 1.00 | 0.1 | 5 | 100 |
| | 7 | C-7 | 0.80 | 0.20 | 1.00 | 0.40 | 0.60 | 1.00 | 0.03 | 4 | 75 |
| | 8 | C-8 | 0.75 | 0.25 | 1.00 | 0.45 | 0.55 | 1.00 | 0.05 | 6 | 75 |

TABLE 9

Figure 5A:
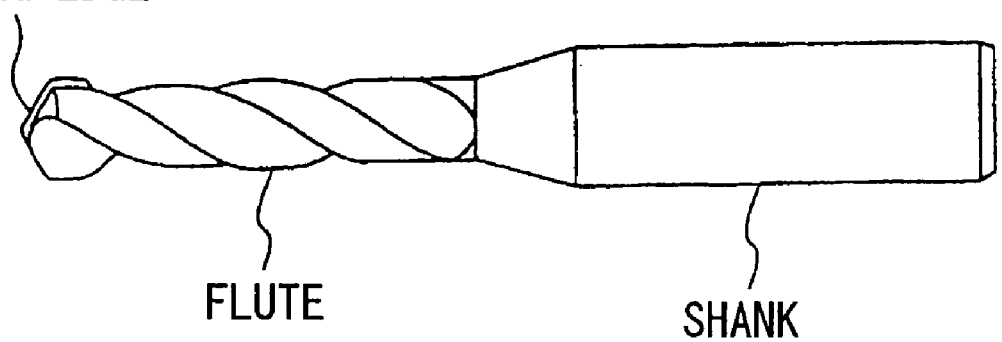
FIG. 5A is a schematic front view showing a coated hard metal drill.
Figure 5B:
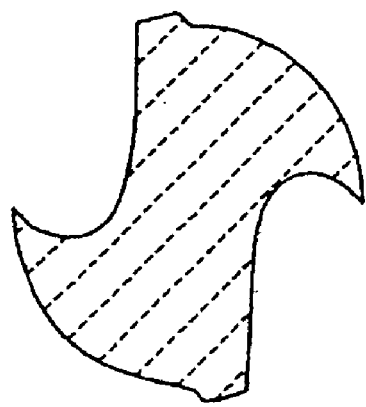
FIG. 5B is a schematic transverse cross-sectional view showing the flute of the drill.

| | | Symbols of hard metal | Hard coating layer | | | | |
|---|---|---|---|---|---|---|---|
| | | | Designated composition (atomic ratio) | | | Designated overall layer | Length of cut |
| Classification | | substrate | Al | Ti | N | thickness (μm) | groove (m) |
| Conventional coated hard metal end mill | 1 | C-1 | 0.60 | 0.40 | 1.00 | 3 | 30 |
| | 2 | C-2 | 0.65 | 0.35 | 1.00 | 7 | 25 |
| | 3 | C-3 | 0.50 | 0.50 | 1.00 | 5 | 30 |
| | 4 | C-4 | 0.40 | 0.60 | 1.00 | 1 | 35 |
| | 5 | C-5 | 0.45 | 0.55 | 1.00 | 2 | 35 |
| | 6 | C-6 | 0.55 | 0.45 | 1.00 | 5 | 30 |
| | 7 | C-7 | 0.40 | 0.60 | 1.00 | 4 | 25 |
| | 8 | C-8 | 0.45 | 0.55 | 1.00 | 6 | 20 | cleaning in acetone, were dried, and were accommodated in the arc ion plating apparatus shown in FIGS. 1A and 1B, and then the method of the present invention was carried out under the same conditions as in Embodiment 1 by which a hard coating layer, which had component concentration profile in which the minimum aluminum containing points and the maximum aluminum containing points having a designated composition shown in TABLE 10 appear alternatingly and repeatedly at a designated interval also shown in TABLE 10 in the thickness direction, and the amount of contained aluminum (or titanium) is continuously changed from the maximum aluminum containing points to the minimum aluminum containing points and from the minimum aluminum containing points to the maximum aluminum containing points, and which had a designated overall layer thickness also shown in TABLE 10, was formed by a vapor deposition method, and thereby surface-coated hard metal drills 1 to 8 of the present invention (hereinafter referred to as coated hard metal drills of the present invention) having a shape whose schematic front view is shown in FIG. 5A, and whose schematic transverse cross-sectional view, specifically at the fluted portion, is shown in FIG. 5B, as the coated cutting tools of the present invention, were fabricated.

For the purpose of comparison, honing processes were applied to the surfaces of the hard metal substrates (drills) D-1 to D-8, the hard metal substrates D-1 to D-8 were subjected to ultrasonic cleaning in acetone, and then the hard metal substrates D-1 to D-8 were dried, and were accommodated in a conventional arc ion plating apparatus shown in FIG. 2. The conventional method was carried out under the same conditions as in the Embodiment 1 by which a hard coating layer, which had a designated composition and a designated layer thickness shown in TABLE 11, and which included an (Al, Ti)N layer in which composition was substantially constant in the direction of the layer thickness, was formed by a vapor deposition method, and thereby conventional surface-coated hard metal drills 1 to 8 (hereinafter referred to as conventional coated hard metal drills), as conventional coated cutting tools, were fabricated.

Next, among the coated hard metal drills 1 to 8 of the present invention and the conventional coated hard metal drills 1 to 8, the coated hard metal drills 1 to 3 of the present invention and the conventional coated hard metal drills 1 to 3 were subjected to lubricated and high-speed drilling tests in which workpieces of tool steel were machined under the following conditions, workpiece: a plate of SKD61 defined in the JIS having a plane size of 100 mm×250 mm, and a thickness of 50 mm,
cutting speed: 70 m/min,
feed: 0.15 mm/rev, and
depth of hole: 8 mm.

The coated hard metal drills 4 to 6 of the present invention and the conventional coated hard metal drills 4 to 6 were subjected to lubricated and high-speed drilling tests in which workpieces of ductile cast iron were machined under the following conditions, workpiece: a plate of FCD450 defined in the JIS having a plane size of 100 mm×250 mm, and a thickness of 50 mm,
cutting speed: 120 m/min,
feed: 0.25 mm/rev, and
depth of hole: 16 mm.

The coated hard metal drills 7 and 8 of the present invention and the conventional coated hard metal drills 7 and 8 were subjected to lubricated and high-speed drilling tests in which workpieces of cast iron were machined under the following conditions, workpiece: a plate of FC250 defined in the JIS having a plane size of 100 mm×250 mm, and a thickness of 50 mm,
cutting speed: 180 m/min,
feed: 0.35 mm/rev, and
depth of hole: 24 mm.

In each of the lubricated and high-speed drilling tests (in which a water-miscible cutting fluid was used), holes were formed until flank wear width of the cutting edge of the tip portion reached 0.3 mm, and the number of the holes was counted. The test results are shown in TABLES 10 and 11.

TABLE 10

| | | | Hard coating layer | | | | | | | | |
|---|---|---|---|---|---|---|---|---|---|---|---|
| | | | Maximum Al containing points Designated composition (atomic ratio) | | | Minimum Al containing points Designated composition (atomic ratio) | | | Designated distance between two points | Designated overall layer thickness | Number of drilled |
| Classification | | Symbols of hard metal substrate | Al | Ti | N | Al | Ti | N | (μm) | (μm) | holes |
| Coated hard metal drill of the present invention | 1 | D-1 | 0.80 | 0.20 | 1.00 | 0.60 | 0.40 | 1.00 | 0.08 | 3 | 4200 |
| | 2 | D-2 | 0.90 | 0.10 | 1.00 | 0.65 | 0.35 | 1.00 | 0.1 | 7 | 3800 |
| | 3 | D-3 | 0.85 | 0.15 | 1.00 | 0.50 | 0.50 | 1.00 | 0.06 | 5 | 4200 |
| | 4 | D-4 | 0.95 | 0.05 | 1.00 | 0.40 | 0.60 | 1.00 | 0.05 | 1 | 2000 |
| | 5 | D-5 | 0.70 | 0.30 | 1.00 | 0.45 | 0.55 | 1.00 | 0.01 | 2 | 2000 |
| | 6 | D-6 | 0.75 | 0.25 | 1.00 | 0.55 | 0.45 | 1.00 | 0.1 | 5 | 2600 |
| | 7 | D-7 | 0.80 | 0.20 | 1.00 | 0.40 | 0.60 | 1.00 | 0.03 | 4 | 1200 |
| | 8 | D-8 | 0.75 | 0.25 | 1.00 | 0.45 | 0.55 | 1.00 | 0.05 | 6 | 1100 |

TABLE 11

| Classification | | Symbols of hard metal substrate | Hard coating layer | | | | Number of drilled holes |
|---|---|---|---|---|---|---|---|
| | | | Designated composition (atomic ratio) | | | Designated layer thickness (μm) | |
| | | | Al | Ti | N | | |
| Conventional coated hard metal drill | 1 | D-1 | 0.60 | 0.40 | 1.00 | 3 | 1200 |
| | 2 | D-2 | 0.65 | 0.35 | 1.00 | 7 | 1400 |
| | 3 | D-3 | 0.50 | 0.50 | 1.00 | 5 | 1400 |
| | 4 | D-4 | 0.40 | 0.60 | 1.00 | 1 | 800 |
| | 5 | D-5 | 0.45 | 0.55 | 1.00 | 2 | 600 |
| | 6 | D-6 | 0.55 | 0.45 | 1.00 | 5 | 800 |
| | 7 | D-7 | 0.40 | 0.60 | 1.00 | 4 | 400 |
| | 8 | D-8 | 0.45 | 0.55 | 1.00 | 6 | 400 |

Embodiment 4

Ingredient powders, i.e., powders of c-BN, TiC, TiN, TiCN, WC, Al, Ti$_3$Al, TiAl, and TiAl$_3$, which are powders of intermetallic compounds of Ti and Al, compound metallic nitride having a composition formula of Ti$_2$AlN, TiB$_2$, AlN, AlB$_2$, and Al$_2$O$_3$, all of which have an average grain size in a range from 0.5 to 4 μm, were prepared and mixed in accordance with blending ratios shown in TABLE 12. The ingredient powders were mixed under wet conditions using a ball mill for 72 hours, were dried, and were compacted under pressure of 100 MPa so as to form a green compact having a diameter of 50 mm and a thickness of 1.5 mm. The green compact was held in a vacuum at a pressure of 1 Pa at a predetermined temperature in a range from 900 to 1300° C. for 30 minutes so as to obtain a pre-sintered compact for forming a cutting piece. The pre-sintered compact was superposed on a supporting piece of a WC based hard metal plate which was separately prepared and had a diameter of 50 mm and a thickness of 2 mm, and which has a composition in which 8 wt % of Co and WC as the balance were included, and then the pre-sintered compact with the supporting piece was inserted into a conventional ultra-high pressure sintering apparatus, and was held under normal sintering conditions, i.e., a pressure of 5 GPa, a temperature in a range from 1200 to 1400° C., and a retention time of 0.5 hours, so as to be sintered under ultra-high pressure conditions. After sintering, upper and lower faces of the sintered compact were ground using a diamond grinding wheel, and the sintered compact was cut into equilateral triangles having 3 mm sides using an arc discharge wire-cut method, and then each of the triangular sintered compacts was brazed to a brazing portion (a corner portion) of a WC based hard metal insert body, which has a shape defined in the CIS standard-TNGA160408 (an equilateral triangle having 16 mm sides and a thickness of 4.76 mm) and has a composition in which 8 wt % of Co, 5 wt % of TaC, and WC as the balance were included, using a brazing agent of an Ag alloy having a composition in which 30 wt % of Cu, 28 wt % of Zn, 2 wt % of Ni, and Ag as the balance were included, and finish grinding was applied so as to obtain c-BN based insert substrates A to R.

Next, the c-BN based insert substrates A to R were subjected to ultrasonic cleaning in acetone, were dried, and were accommodated in the arc ion plating apparatus shown in FIGS. 1A and 1B, and then the method of the present invention was carried out under the same conditions as in Embodiment 1 by which a hard coating layer, which had a component concentration profile in which the minimum aluminum containing points and the maximum aluminum containing points having a designated composition shown in TABLE 13 appear alternatingly and repeatedly at a designated interval also shown in TABLE 13 in the thickness direction, and the amount of contained aluminum (or titanium) is continuously changed from the maximum aluminum containing points to the minimum aluminum containing points and from the minimum aluminum containing points to the maximum aluminum containing points, and which had a designated overall layer thickness also shown in TABLE 13, was formed by a vapor deposition method, and thereby coated c-BN based tools 1 to 18 of the present invention were fabricated.

For the purpose of comparison, conventional coated c-BN based tools 1 to 18 were fabricated under the same conditions as for the coated c-BN based tools 1 to 18 of the present invention except that a hard coating layer was formed on each of the c-BN based insert substrates A to R by accommodating the c-BN based insert substrates A to R in the conventional arc ion plating apparatus shown in FIG. 2, by carrying out the conventional method under the same conditions as in the Embodiment 1 by which the hard coating layer, which had a designated composition and a designated layer thickness shown in TABLE 14, and which included an (Al, Ti)N layer in which composition was substantially constant in the direction of the layer thickness, was formed by a vapor deposition method.

Next, the coated c-BN based tools 1 to 18 of the present invention and the conventional coated c-BN based tools 1 to 18 were subjected to cutting tests by attaching each of them to a tip portion of a cutting tool made of tool steel using a fixing bridge and a screw. The detailed test conditions were set as follows:

with regard to high-speed, dry, and interrupted turning tests in which workpieces of alloy steel were machined,
workpiece: a circular bar with four evenly distributed longitudinal grooves made of carburized and hardened SMC440 (surface hardness: HRC60) defined in the JIS,
cutting speed: 250 m/min,
depth of cut: 0.3 mm,
feed: 0.07 mm/rev,
time: 10 min;

with regard to high-speed, dry, and interrupted turning tests in which workpieces of carbon steel were machined,
workpiece: a circular bar with four evenly distributed longitudinal grooves made of high-frequency hardened S45C (surface hardness: HRC55) defined in the JIS,
cutting speed: 300 m/min,
depth of cut: 0.1 mm, feed: 0.3 mm/rev,
time: 10 min; and with regard to high-speed, dry, and interrupted turning tests in which workpieces of cast iron were machined,
workpiece: a circular bar with four evenly distributed longitudinal grooves made of FC300 defined in the JIS,
cutting speed: 500 m/min,
depth of cut: 0.5 mm,
feed: 0.15 mm/rev,
time: 60 min.

In each of the turning tests, flank wear width of the cutting edge was measured. The test results are shown in TABLES 13 and 14.

TABLE 12

| Classification | | TiC | TiN | TiCN | WC | Al | TiAl$_3$ | TiAl | Ti$_3$Al | Ti$_2$AlN | TiB$_2$ | AlN | AlB$_2$ | Al$_2$O$_3$ | c-BN |
|---|---|---|---|---|---|---|---|---|---|---|---|---|---|---|---|
| c-BN | A | — | 40 | — | — | — | 8 | — | — | — | — | — | — | 2 | Balance |
| based | B | 55 | — | — | — | — | 7 | — | — | — | — | — | — | 1 | Balance |
| insert | C | — | 20 | — | — | — | 1 | — | — | — | — | — | — | 1 | Balance |
| substrate | D | — | 30 | 8 | — | — | 5 | — | — | — | — | — | — | — | Balance |
| | E | 25 | — | — | 2 | — | — | — | 5 | — | — | — | — | 3 | Balance |
| | F | — | 40 | — | — | 10 | — | — | — | — | — | — | — | 5 | Balance |
| | G | 15 | — | 10 | 1 | — | — | 10 | — | — | 2 | 2 | — | — | Balance |
| | H | — | 20 | 20 | — | 10 | — | — | — | — | — | — | 5 | 5 | Balance |
| | I | 10 | 10 | — | 5 | — | 10 | — | — | — | — | — | — | — | Balance |
| | J | — | — | 15 | — | — | — | — | — | 10 | 2 | — | — | 3 | Balance |
| | K | — | 25 | — | — | — | 5 | — | — | 10 | — | — | — | 5 | Balance |
| | L | 20 | — | 20 | — | — | — | 10 | 10 | — | — | 5 | — | — | Balance |
| | M | — | — | 35 | — | 5 | — | — | 10 | — | — | — | 5 | 5 | Balance |
| | N | 10 | 10 | — | — | — | — | — | — | 10 | — | — | — | — | Balance |
| | O | 30 | — | — | 3 | — | 10 | — | — | — | 2 | — | — | 5 | Balance |
| | P | 30 | — | — | — | — | 4 | 4 | — | — | — | — | 2 | — | Balance |
| | Q | — | 25 | 25 | — | 5 | — | — | 5 | 10 | — | — | — | — | Balance |
| | R | — | 25 | 2 | — | 5 | 10 | — | — | — | — | 2 | — | 3 | Balance |

TABLE 13

| | | | Hard coating layer | | | | | | | | |
|---|---|---|---|---|---|---|---|---|---|---|---|
| | Symbols | | Maximum Al containing points | | | Minimum Al containing points | | | Designated | Designated | Flank wear width (mm) | | |
| | of c-BN based insert | Designated composition (atomic ratio) | | | Designated composition (atomic ratio) | | | distance between two points | overall layer thickness | Interrupted high speed cutting of | Interrupted high speed cutting of | Interrupted high speed cutting of |
| Classification | substrate | Al | Ti | N | Al | Ti | N | (μm) | (μm) | alloy steel | carbon steel | cast iron |
| c-BN | 1 | A | 0.80 | 0.20 | 1.00 | 0.60 | 0.40 | 1.00 | 0.08 | 2 | 0.06 | 0.05 | 0.06 |
| based | 2 | B | 0.75 | 0.25 | 1.00 | 0.40 | 0.60 | 1.00 | 0.03 | 3 | 0.08 | 0.06 | 0.08 |
| tool of | 3 | C | 0.90 | 0.10 | 1.00 | 0.55 | 0.45 | 1.00 | 0.01 | 2 | 0.09 | 0.07 | 0.08 |
| the | 4 | D | 0.95 | 0.05 | 1.00 | 0.65 | 0.35 | 1.00 | 0.10 | 2 | 0.10 | 0.09 | 0.10 |
| present | 5 | E | 0.70 | 0.30 | 1.00 | 0.45 | 0.55 | 1.00 | 0.07 | 6 | 0.09 | 0.06 | 0.07 |
| invention | 6 | F | 0.90 | 0.10 | 1.00 | 0.60 | 0.40 | 1.00 | 0.05 | 2 | 0.08 | 0.07 | 0.08 |
| | 7 | G | 0.80 | 0.20 | 1.00 | 0.45 | 0.55 | 1.00 | 0.05 | 5 | 0.09 | 0.07 | 0.09 |
| | 8 | H | 0.70 | 0.30 | 1.00 | 0.40 | 0.60 | 1.00 | 0.05 | 1 | 0.07 | 0.07 | 0.08 |
| | 9 | I | 0.75 | 0.25 | 1.00 | 0.55 | 0.45 | 1.00 | 0.10 | 4 | 0.06 | 0.06 | 0.07 |
| | 10 | J | 0.80 | 0.20 | 1.00 | 0.50 | 0.50 | 1.00 | 0.05 | 2 | 0.08 | 0.07 | 0.09 |
| | 11 | K | 0.85 | 0.15 | 1.00 | 0.45 | 0.55 | 1.00 | 0.05 | 2 | 0.09 | 0.10 | 0.11 |
| | 12 | L | 0.90 | 0.10 | 1.00 | 0.65 | 0.35 | 1.00 | 0.05 | 8 | 0.09 | 0.08 | 0.07 |
| | 13 | M | 0.80 | 0.20 | 1.00 | 0.60 | 0.40 | 1.00 | 0.07 | 4 | 0.06 | 0.05 | 0.05 |
| | 14 | N | 0.75 | 0.25 | 1.00 | 0.60 | 0.40 | 1.00 | 0.08 | 2 | 0.05 | 0.06 | 0.06 |
| | 15 | O | 0.85 | 0.15 | 1.00 | 0.50 | 0.50 | 1.00 | 0.05 | 1 | 0.09 | 0.07 | 0.08 |
| | 16 | P | 0.70 | 0.30 | 1.00 | 0.45 | 0.55 | 1.00 | 0.03 | 3 | 0.09 | 0.07 | 0.09 |
| | 17 | Q | 0.80 | 0.20 | 1.00 | 0.50 | 0.50 | 1.00 | 0.07 | 1.5 | 0.07 | 0.06 | 0.07 |
| | 18 | R | 0.95 | 0.05 | 1.00 | 0.40 | 0.60 | 1.00 | 0.05 | 5 | 0.10 | 0.11 | 0.10 |

TABLE 14

| Classification | | Symbols of c-BN based insert substrate | Hard coating layer Designated composition (atomic ratio) | | | Designated overall layer thickness (μm) | Flank wear width (mm) | | |
|---|---|---|---|---|---|---|---|---|---|
| | | | Al | Ti | N | | Interrupted high speed cutting of alloy steel | Interrupted high speed cutting of carbon steel | Interrupted high speed cutting of cast iron |
| Conventional c-BN based tool | 1 | A | 0.60 | 0.40 | 1.00 | 2 | Tool Life Ended in 4 minutes | Tool Life Ended in 6 minutes | Tool Life Ended in 35 minutes |
| | 2 | B | 0.40 | 0.60 | 1.00 | 3 | in 6 minutes | in 5 minutes | in 35 minutes |
| | 3 | C | 0.55 | 0.45 | 1.00 | 2 | in 4 minutes | in 5 minutes | in 30 minutes |
| | 4 | D | 0.65 | 0.35 | 1.00 | 2 | in 8 minutes | in 7 minutes | in 25 minutes |
| | 5 | E | 0.45 | 0.55 | 1.00 | 6 | in 5 minutes | in 7 minutes | in 50 minutes |
| | 6 | F | 0.60 | 0.40 | 1.00 | 2 | in 5 minutes | in 4 minutes | in 25 minutes |
| | 7 | G | 0.45 | 0.55 | 1.00 | 5 | in 4 minutes | in 6 minutes | in 25 minutes |
| | 8 | H | 0.40 | 0.60 | 1.00 | 1 | in 6 minutes | in 5 minutes | in 40 minutes |
| | 9 | I | 0.55 | 0.45 | 1.00 | 4 | in 5 minutes | in 5 minutes | in 25 minutes |
| | 10 | J | 0.50 | 0.50 | 1.00 | 2 | in 7 minutes | in 7 minutes | in 45 minutes |
| | 11 | K | 0.45 | 0.55 | 1.00 | 2 | in 6 minutes | in 7 minutes | in 35 minutes |
| | 12 | L | 0.65 | 0.35 | 1.00 | 8 | in 5 minutes | in 6 minutes | in 40 minutes |
| | 13 | M | 0.60 | 0.40 | 1.00 | 4 | in 5 minutes | in 4 minutes | in 25 minutes |
| | 14 | N | 0.60 | 0.40 | 1.00 | 2 | in 6 minutes | in 3 minutes | in 35 minutes |
| | 15 | O | 0.50 | 0.50 | 1.00 | 1 | in 4 minutes | in 4 minutes | in 20 minutes |
| | 16 | P | 0.45 | 0.55 | 1.00 | 3 | in 8 minutes | in 7 minutes | in 30 minutes |
| | 17 | Q | 0.50 | 0.50 | 1.00 | 1.5 | in 7 minutes | in 6 minutes | in 30 minutes |
| | 18 | R | 0.40 | 0.60 | 1.00 | 5 | in 5 minutes | in 5 minutes | in 30 minutes |

The compositions of the minimum aluminum containing points and the minimum aluminum containing points of the hard coating layers which were included in the coated cutting tools of the present invention, i.e., in the coated hard metal inserts 1 to 8 of the present invention, in the coated hard metal end mills 1 to 8 of the present invention, in the coated c-BN based tools 1 to 18 of the present invention, and the compositions of the hard coating layers which were included in the conventional coated cutting tools, i.e., in the conventional coated hard metal inserts 1 to 8, in the conventional coated hard metal end mills 1 to 8, in the conventional coated c-BN based tools 1 to 18, were measured using an Auger spectroscopic analyzer, and it was confirmed that the compositions were substantially the same as the designated compositions, respectively.

In addition, the distances between the minimum aluminum containing points and the minimum aluminum containing points, and the overall thicknesses of the hard coating layers of the coated cutting tools of the present invention, and the thicknesses of the hard coating layers of the conventional coated cutting tools were measured using a scanning electron microscope, and it was confirmed that the distances and thicknesses were substantially the same as the designated ones, respectively.

According to the results shown in TABLES 3 to 14, it is apparent that the coated cutting tools of the present invention, which include the hard coating layer having a component concentration profile in which the maximum aluminum containing points and the minimum aluminum containing points appear alternatingly and repeatedly at a predetermined interval in a direction of thickness of the hard coating layer, and the amount of contained aluminum (or titanium) is continuously changed from the maximum aluminum containing points to the minimum aluminum containing points and from the minimum aluminum containing points to the maximum aluminum containing points, exhibit a superior wear resistance during a high speed cutting operation for steels and cast irons in which a significant amount of heat is generated, and in contrast, the conventional coated cutting tools, in which the hard coating layer is of the (Al, Ti)N layer in which composition is substantially constant in the direction of the layer thickness, exhibit excessive wear of the cutting edge and relatively short tool life due to insufficient high temperature properties during high speed cutting operations under high temperature conditions.

As explained above, because the coated cutting tools of the present invention exhibit a superior wear resistance during a high speed cutting operation for various kinds of steels and cast irons, and exhibit a superior cutting performance for a long term, the coated cutting tools of the present invention can sufficiently meet the demand of high performance of the cutting operation apparatus, and demands of less power, less energy, and lower cost in cutting operations.

The invention claimed is:

1. A surface-coated cutting tool member whose hard coating layer exhibiting a superior wear resistance during a high speed cutting operation, the surface-coated cutting tool member comprising:
cemented carbide substrate containing tungsten carbide, a cermet substrate containing titanium carbonitride, or a sintered substrate containing cubic boron nitride; and
a hard coating layer of a nitride compound containing aluminum and titanium, which is formed on a surface of the substrate using a physical vapor deposition method at an overall average thickness of 1 to 15 μm,
wherein the hard coating layer has a component concentration profile in which maximum aluminum containing points (minimum titanium containing points) and minimum aluminum containing points (maximum titanium containing points) appear alternately and repeatedly at a predetermined interval in a direction of thickness of the hard coating layer, and the amount of contained aluminum (or titanium) is continuously changed from the maximum aluminum containing points to the minimum aluminum containing points and from the minimum aluminum containing points to the maximum aluminum containing points, wherein the maximum aluminum containing points satisfy a composition formula of $(Al_X Ti_{1-X})N$ (where X indicates an atomic ratio of 0.70 to 0.95), the minimum aluminum containing points satisfy a composition formula of $(Al_Y Ti_{1-Y})N$ (where Y indicates an atomic ratio of 0.40 to 0.65), and wherein a distance between one of the maximum aluminum containing points and adjacent one of the minimum aluminum containing points is from 0.01 to 0.1 μm.

2. A method for forming a hard coating layer exhibiting a superior wear resistance during a high speed cutting operation on a surface of a cutting tool, the method comprising the step of:

mounting the cutting tool of at least one of a cemented carbide containing tungsten carbide and a cermet containing titanium carbonitride and a sintered material containing cubic boron nitride on a turntable housed in an arc ion plating apparatus at a position radially away from a center axis of the turntable in a manner rotatable about an axis of the cutting tool;

producing a nitrogen gas atmosphere as the reaction atmosphere in the arc ion plating apparatus; and generating arc discharge between a cathode electrode of an Al—Ti alloy for forming maximum aluminum containing points (minimum titanium containing points) and an anode electrode, and between another cathode electrode of a Ti—Al alloy for forming minimum aluminum containing points (maximum titanium containing points), which is disposed so as to oppose to the cathode electrode of an Al—Ti alloy with respect to the turntable, and another anode electrode, so that a hard coating layer having overall average thickness of 1 to 15 μm is formed, by a physical vapor deposition method, on the surface of the cutting tool being turned while rotating on the turntable about an axis of the cutting tool, wherein the hard coating layer has a component concentration profile in which the maximum aluminum containing points (the minimum titanium containing points) and the minimum aluminum containing points (the maximum titanium containing points) appear alternately and repeatedly at a predetermined interval in a direction of thickness of the hard coating layer, and the amount of contained aluminum (or titanium) is continuously changed from the maximum aluminum containing points to the minimum aluminum containing points and from the minimum aluminum containing points to the maximum aluminum containing points, wherein the maximum aluminum containing points satisfy a composition formula of $(Al_X Ti_{1-X})N$ (where X indicates an atomic ratio of 0.70 to 0.95), the minimum aluminum containing points satisfy a composition formula of $(Al_Y Ti_{1-Y})N$ (where Y indicates an atomic ratio of 0.40 to 0.65), and wherein a distance between one of the maximum aluminum containing points and adjacent one of the minimum aluminum containing points is from 0.01 to 0.1 μm.

* * * * *